(12) United States Patent
Tomono

(10) Patent No.: US 7,202,569 B2
(45) Date of Patent: Apr. 10, 2007

(54) SEMICONDUCTOR DEVICE AND MANUFACTURING METHOD OF THE SAME

(75) Inventor: Akira Tomono, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/986,385

(22) Filed: Nov. 12, 2004

(65) Prior Publication Data
US 2006/0033214 A1  Feb. 16, 2006

(30) Foreign Application Priority Data
Aug. 13, 2004  (JP) .......................... P2004-235850

(51) Int. Cl.
*H01L 23/48* (2006.01)
(52) U.S. Cl. .................. 257/772; 257/737; 257/778; 257/738; 257/783; 257/779; 257/780; 257/734; 257/781
(58) Field of Classification Search ................ 257/772, 257/737, 778, 738, 783, 779, 780, 734
See application file for complete search history.

(56) References Cited

U.S. PATENT DOCUMENTS

| 6,204,558 B1* | 3/2001 | Yanagida ................ 257/737 |
| 6,559,527 B2* | 5/2003 | Brofman et al. ............ 257/678 |
| 2002/0171157 A1* | 11/2002 | Soga et al. .................. 257/783 |

2003/0011077 A1   1/2003   Morishima et al.

FOREIGN PATENT DOCUMENTS

| JP | 10-012659 | 1/1998 |
| JP | 10-209626 | 8/1998 |
| JP | 10-294337 | 11/1998 |
| JP | 2000-232119 | 8/2000 |
| JP | 2002-190497 | 7/2002 |

OTHER PUBLICATIONS

Notice of Reason of Rejection issued by the Japanese Patent Office on Jul. 25, 2006, for Japanese Application No. 2004-235850, and English-language translation thereof.

* cited by examiner

*Primary Examiner*—Eddie Lee
*Assistant Examiner*—Junghwa Im
(74) *Attorney, Agent, or Firm*—Finnegan, Henderson, Farabow, Garrett & Dunner, L.L.P.

(57) ABSTRACT

A semiconductor device comprises a semiconductor element which is flip-chip bonded to a circuit substrate. The semiconductor element and the circuit substrate are flip-chip bonded using a sealing resin having flux function. The semiconductor element includes a solder bump formed on a first electrode pad through a first low melting point solder layer. The circuit substrate includes a second electrode pad corresponding to the first electrode pad, and a second low melting point solder layer is formed on the second electrode pad. The solder bump is bonded to the first and second electrode pads through the first and second low melting point solder layers.

9 Claims, 15 Drawing Sheets

SEMICONDUCTOR DEVICE AND MANUFACTURING METHOD OF THE SAME

CROSS REFERENCE TO RELATED APPLICATION

This application is based upon and claims the benefit of priority from the prior Japanese Patent Application No. 2004-235850, filed on Aug. 13, 2004; the entire contents of which are incorporated herein by reference.

BACKGROUND

1. Field of the Invention

The present invention relates to a semiconductor device to which flip-chip bonding is applied, and a manufacturing method thereof.

2. Description of the Related Art

In recent years, the flip-chip bonding is exploited as a technique for mounting with shorter wire and connection lengths in order to cope with the microchip (semiconductor element) with increased pins, finer pitch, and faster signal speed. The microchip used for flip-chip bonding contains, for example, electrode pads formed planimetrically and solder bumps formed on the electrode pads. On the other hand, the circuit substrate on which the microchip is to be mounted has electrode pads formed in positions corresponding to the electrode pads of the microchip. The flip-chip bonding is a method to place the electrode pads of the microchip and those of the circuit substrate so that they face each other, and bond the electrode pads of the microchip and those of the circuit substrate by heating and dissolving the solder bumps therebetween.

Normally, a flux paste is applied to the surface of the circuit substrate in order to reduce the oxide films on the solder bumps, after which the microchip is aligned and mounted on the circuit substrate. Subsequently, the solder bumps are heated and dissolved using a reflow oven so that the electrode pads of both sides are bonded, and thereafter the flux is cleaned. Then, sealing resin (underfill material) is filled between the circuit substrate and the microchip and cured. The semiconductor device exploiting the flip-chip bonding is thus manufactured. Further, for the flip-chip bonding, sealing resin having flux function, so-called no-flow underfill material, is also used so as to simplify the bonding process. The bonding process using the sealing resin with flux function omits the steps to clean the flux and filing the sealing resin, allowing process simplification and cost reduction.

Hereinafter, the bonding process using the sealing resin with flux function is explained with reference to FIGS. 12 to 14. First, as shown in FIG. 12, solder bumps 3 composed of a high melting point solder such as a Sn—Ag solder (melting point: 221° C.) are formed on electrode pads 2 of a microchip 1. On the other hand, on electrode pads 5 of a circuit substrate 4, on which the microchip 1 is to be mounted, low melting point solder layers 6 composed of Sn—Bi solder (melting point: 139° C.) and the like are formed. Sealing resin 7 with the flux function is then applied over the circuit substrate 4. Here, in general, the circuit substrate 4 exhibits warp of about 20 to 50 μm within the mounting area (15 to 20 mm of square).

Next, as shown in FIG. 13, the microchip 1 is absorbed and retained by a mounting tool 8. The mounting tool 8 is preheated at a temperature at which only the low melting point solder layers 6 melt (for example, 139° C. or higher and lower than 221° C.). After aligning the electrode pads 2 of the microchip 1 and the electrode pads 5 of the circuit substrate 4, the microchip 1 is pressed onto the circuit substrate 4 through over the sealing resin 7. While retaining this pressing state, the mounting tool 8 heats the sealing resin 7 and the low melting point solder layers 6. The flux facility of the sealing resin 7 activated by heating eliminates the oxidize film and foreign substance in the bonded interface, while only the low melting point solder layers 6 are dissolved and wetted up to the solder bumps 3. At this stage, the circuit substrate 4 is in parallel by the pressing force. The microchip 1 is thus tentatively bonded to the substrate 4.

Thereafter, the microchip 1 is released from the mounting tool 8. At this stage, the pressing force imposed on the microchip 1 is eliminated, so that the circuit substrate 4 is warped back as shown in FIG. 14. The low melting point solder layers 6 are still in the melting state immediately after the pressing force is released, so that they may be pulled apart as shown in FIG. 15, depending on the degree of warping back of the circuit substrate 4. Subsequently, the sealing resin 7 is cured and hardened, which causes disconnection in the parts where the low melting point solder layers 6 are pulled apart after the final connection process of heating and dissolving the solder bumps 3 is performed. Thus, the problem for the flip-chip bonding process using the sealing resin with flux function is the disconnection occurrence due to warp of the circuit substrate 4.

Further, in order to cope with even finer pitches and higher signal speeds of a microchip, application of copper wiring for lowering resistance and low dielectric constant insulating film (low-κ film) for reducing inter-wiring capacity is being proceeded. However, materials composing the low-κ film in general have a drawback of lower mechanical and adhesion strengths. Accordingly, in the flip-chip bonding process, the low-κ film itself or interface thereof are likely to cause cracking and exfoliation due to thermal stress caused by the thermal expansion coefficient difference between the microchip and the circuit substrate. In particular, use of zinc-free solders such as the Sn—Ag solder causes a large thermal stress during the solder bump reflowing step, where cracking or exfoliation is likely to occur because of the low mechanical and adhesive strengths of the low-κ film.

Incidentally, varieties of proposals have been provided regarding the structure of the solder bump or the soldering method. For example, the Japanese Patent Laid-open Application No. Hei 10-294337 provides a bump electrode configuration composed of a high melting point solder metal layer, mid melting point solder metal layer, and low melting point solder layer formed in the order thereof from the side of the circuit substrate. This configuration allows lowering of the thermal stress based on the thermal expansion coefficient difference between the microchip and the circuit substrate in the bump electrodes, in such a manner that the high-strength high melting point solder metal layer is formed on the circuit substrate side. Such a bump configuration may contribute to lowering of the stress against the microchip, but is not effective enough against the disconnection due to the warping back of the circuit substrate.

The Japanese Patent Laid-open Application No. Hei 10-209626 provides a method to form solder layers on both ends of a pillar composed of a high melting point conductive material, to tentatively bond the solder layers on the both ends with a flux which provides adhesion to the electrodes pads of the microchip and the substrate, and to perform soldering by melting and solidifying the solder layers of the both ends. However, such a soldering method is not at all applicable to the flip-chip bonding of a microchip with increased number of pins. The Japanese Patent Laid-open Application. No. Hei 10-12659 presents a configuration that metal bumps provided on the microchip side and high melting point solder bumps provided on the circuit substrate side are bonded together through lower melting point layers. In such a bonding configuration, a satisfactory effect cannot be attained against the disconnection due to warping back of the circuit substrate, nor reduction of the stress can be expected.

SUMMARY

Accordingly, it is an object of the present invention to provide a semiconductor device and manufacturing method thereof which is capable of, when applying the flip-chip bonding using sealing resin with flux function, effectively controlling disconnection in a bump bonded portion attributed to warping back of a circuit substrate.

A semiconductor device according to one aspect of the present invention comprises: a semiconductor element including a semiconductor element body, a first electrode pad provided on the semiconductor element body, and a first low melting point solder layer formed on the first electrode pad; a circuit substrate including a second electrode pad corresponding to the first electrode pad, and a second low melting point solder layer formed on the second electrode pad; a connection part including a solder bump composed of high melting point solder formed on one low melting point solder layer among the first and second low melting point solder layers, and in which the first and second electrode pads are connected through the solder bump bonded to the other low melting point solder layer; and a sealing resin having flux function which is filled in between the semiconductor element and the circuit substrate such that the connection part is sealed.

A manufacturing method of a semiconductor device according to one aspect of the present invention comprises: forming a first low melting point solder layer on a first electrode pad of a semiconductor element; forming a second low melting point solder layer on a second electrode pad of a circuit substrate; forming a solder bump composed of high melting point solder on one of the first and second low melting point solder layers; applying sealing resin with flux function to a surface of at least one of the semiconductor element and the circuit substrate; aligning the first electrode pad of the semiconductor element and the second electrode pad of the circuit substrate and thereafter abutting the semiconductor element on the circuit substrate through over the sealing resin; dissolving only the first and second low melting point solder layers while imposing pressing force against the semiconductor element, and bonding the solder bump to the other low melting point solder layer; and releasing the pressing force against the semiconductor element and thereafter curing the sealing resin.

BRIEF DESCRIPTION OF THE DRAWINGS

While the present invention is described with reference to drawings, they are provided for the exclusive purpose of illustration, and are not to limit the present invention in whatever manner.

DETAILED DESCRIPTION

The embodiments of the present invention will be described hereinafter with reference to the drawings. While the embodiments of the present invention are described based on the drawings, it should be noted that the drawings are provided for the exclusive purpose of illustration, and not to limit the scope of the present invention.

Figure 1:
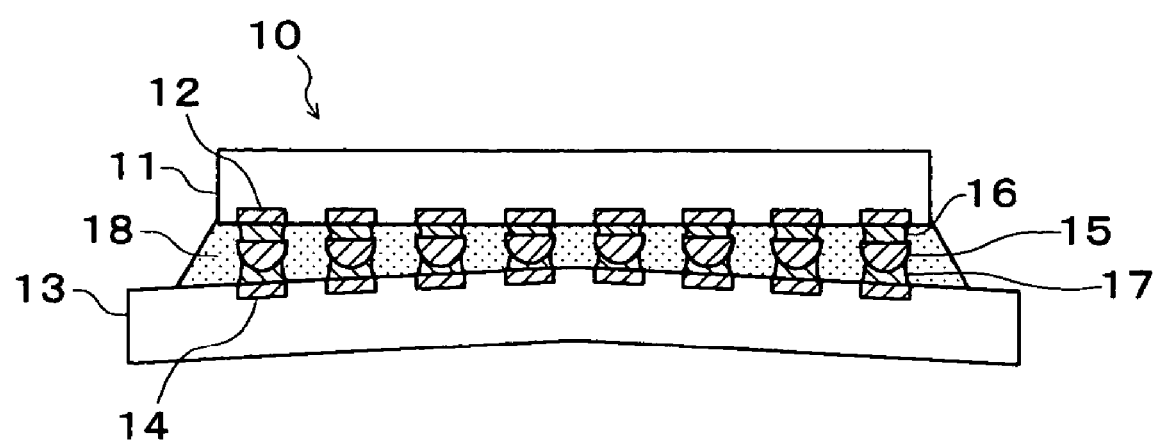
FIG. 1 is a view showing a general configuration of a semiconductor device according to a first embodiment of the present invention.

FIG. 1 is a sectional view showing a general configuration of a semiconductor device according to a first embodiment of the present invention. A semiconductor device (semiconductor module) 10 shown in FIG. 1 has so-called flip-chip bonding configuration, in which each of first electrode pads 12 provided in a microchip (semiconductor element) 11 and each of second electrode pads 14 provided in a circuit substrate 13 are electrically and mechanically bonded connection parts each including a solder bump 15. The solder bump 15 consists of high melting point solder, and is formed on the first electrode pad 12 through a low melting point solder layer 16. Further, the solder bump 15 is bonded to a second low melting point solder layer 17 formed on the second electrode pad 14. That is to say, the first electrode pad 12 and the second electrode pad 14 are electrically connected through the first low melting point solder layer 16, the solder bump 15 and the second low melting point solder layer 17.

In a gap part between the microchip 11 and the circuit substrate 13, a sealing resin 18 is filled in as an underfill material. The sealing resin 18 is hardened by a curing treatment. With the sealing-resin 18, the solder bump 15 and the first and second electrode pads 12 and 14 are sealed airtightly. The sealing resin 18 has flux function, and is so-called no-flow underfill material. Used as the sealing resin 18 having such flux function, for example, is a resin composition in which an acid anhydride and the like providing flux function is blended with epoxy resin, acrylic resin, amine resin, silicone resin, or polyimide resin.

Figure 2:
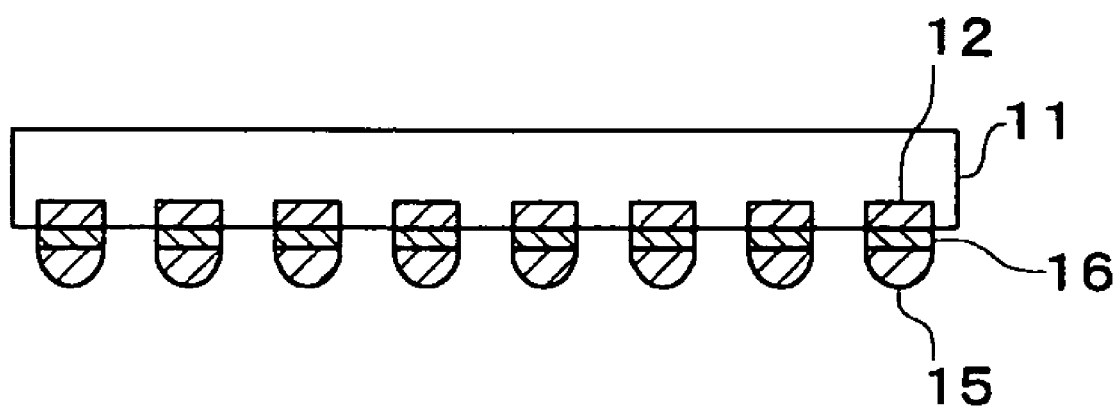
FIG. 2 is a view showing a general configuration of a semiconductor element applied in the semiconductor device shown in FIG. 1.

The detail of the aforementioned semiconductor device 10 is hereinafter provided including a process of manufacturing the semiconductor device 10. The microchip 11, which is a component of one side of the semiconductor device 10, includes a plurality of first electrode pads 12 formed on the surface thereof as shown in FIG. 2, and the first electrode pads 12 are electrically connected to an inner circuit which is not shown. The first low melting point solder layer 16 is formed on each of the first electrode pads 12, further the solder bump 15 composed of high melting point solder is formed on each of the first low melting point solder layer 16. The solder bumps 15 are arranged, for example, in matrix in a predetermined area so as to cope with the increased number of pins.

The low melting point solder and the high melting point solder referred to herein are those satisfying the condition: $Mp_1 < Mp_2$, where $Mp_1$ is the melting point of the low melting point solder and $Mp_2$ is the melting point of the high melting point solder. The low melting point solder layer 16 shall have a melting point $Mp_1$ which is lower than a melting point $Mp_2$ of the high melting point solder composing the solder bump 15, but practically it is preferable that $Mp_1$ is lower than $Mp_2$ of the high melting point solder by 20° C. or over. Varied solder metals satisfying the above condition can be used as the high melting point solder composing the solder bump 15 and the first low melting point solder layer 16. The same applies to the second low melting point solder layer 17.

The constituent material of the solder bump 15 may be, for example, a Sn—Ag solder alloy (melting point: 221° C.), Sn—Ag—Cu solder alloy (melting point: 217° C.), Sn—Zn solder alloy (melting point: 199° C.), Sn—Pb solder alloy (melting point: 183° C.), or the like. It is preferred to use a solder metal which contains virtually no Pb (a lead-free solder), since it is demanded to reduce the quantity of lead to be used considering the environmental load and effect on human body. In particular, Sn—Ag type solder alloys (including the Sn—Ag solder alloy or Sn—Ag—Cu solder alloy) are highly practicable, and suitable as a material for the solder bump 15.

The first and second low melting point solder layers 16, 17 are formed, for example, of a Sn—Bi solder alloy (melting point: 139° C.), Sn—Bi—Ag solder alloy (melting point: 138° C.), Sb—Zn—Bi solder alloy (melting point: 190° C.), Bi—In solder alloy (melting point: 72.4° C.), Bi—Pd solder alloy (melting point: 126° C.), Sn—In solder alloy (melting point: 118° C.), In—Ag solder alloy (melting point: 144° C.), or so forth. Those solder alloys listed as a constituent material of the solder bump 15 may also be used for the first and second low melting point solder layers 16 and 17 if they are a solder alloy with a melting point lower than the that of solder bump 15. Particularly among them, it is preferable to use a Bi type solder alloy containing Bi which may raise the melting point when alloyed with the high melting point solder composing the solder bump 15.

The first low melting point solder layer 16 may be formed by an electroplating method, for example. It is also possible to form the first low melting point solder layer 16 by forming a mask over the surface of the microchip 11 excluding the first electrode pads 12, and applying the low melting point solder paste. The solder bump 15 may be formed, for example, by electroplating, or by using a micro-ball constituted of a high melting point solder. It is possible to form the solder bump 15 by applying the flux over the first low melting point solder layer 16, mounting the micro-ball composed of the high melting point solder thereon, heating the micro-ball to a temperature which is at the melting point of the low melting point solder or higher and lower than the melting point of the high melting point solder, dissolving the low melting point solder layer 16 only, and fixing the micro-ball composed of high melting point solder. Note that when the micro-ball composed of high melting point solder is mounted after the step of applying the first melting point solder layer 16, the step of applying the flux can be omitted.

The projecting shape of the solder bump 15 and the fist low melting point solder layer 16 are not particularly specified, but it is preferable that a height H of the projection (the total height of the solder bump 15 and the first low melting point solder layer 16) is in the range of 75 to 100% of the largest diameter D of the solder bump 15. If the height H of the projection is less than 75% of the largest diameter D of the solder bump 15, where the ratio between the solder bump 15 and the first low melting point solder layer 16 is constant, the volume of the first low melting point solder layer 16 becomes smaller in proportion to the height H of the projection, suggesting that it may make it impossible to endure the warping back of the circuit substrate 13 after releasing the pressing force. Further, when the volume of the first low melting point solder layer 16 is constant, the volume ratio of the solder bump 15 becomes proportionally smaller, leading to a lower melting point of a bonding alloy formed by eventually dissolving the solder bump 15, and causing deterioration of the heat cycle characteristics, reliability, and so forth. On the other hand, if the height H of the projection exceeds 100% of the largest diameter D of the solder bump 15, the possibility becomes higher that the sealing resin 18 may contain air in the bonding process, and a consequent void failure tends to take place.

Figure 3:
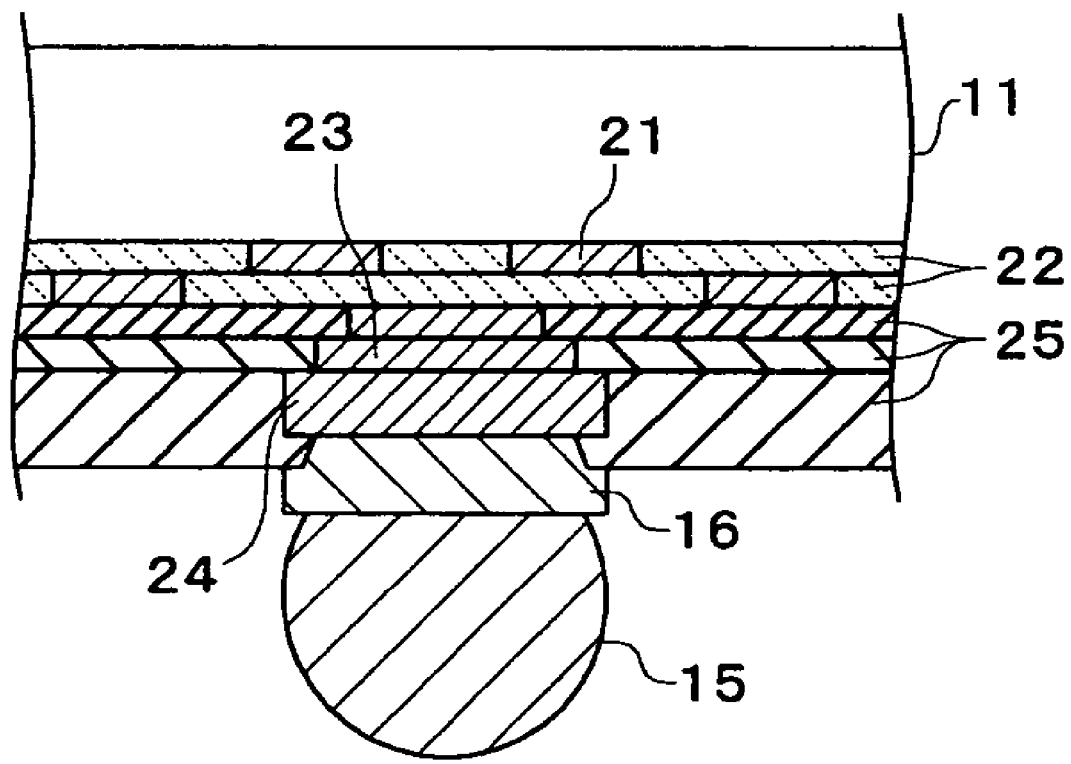
FIG. 3 is a sectional view of a main configuration of a semiconductor element shown in FIG. 2.

The microchip (microchip body) on which the solder bump 15 and the first low melting point solder layer 16 are formed, as shown in the enlarged view of FIG. 3, has a circuit part including a copper wiring 21 and a low dielectric constant insulating film (low-κ film) 22. For the low dielectric constant insulating film 22, such a material as having a relative dielectric constant of 3.5 or less is used, for example. Cited as examples of such a low dielectric constant insulating film 22 are silicon oxide film doping fluorine (SiOF film), silicon oxide film doping carbon (SiOC film), organic silica film, HSQ (hydrogen silsesquioxane) film, MSQ (methyl silsesquioxane) film, BCB (benzocyclobutene) film, PAE (polyarylether) film, PTFE (polytetrafluoroethylene) film, and porous films composed of those materials.

On the bump connecting part of the copper wiring 21 is formed a copper pad 23, further on which is formed an aluminum pad 24. The stacked film of the copper pad 23 and the aluminum pad 24 forms the electrode pad 12 of the microchip 11. Note that in the drawing, 25 represents a passivation film composed of $SiO_2$, $Si_3N_4$ and so forth. Further, between the aluminum pad 24 and the first low melting point solder layer 16 is formed a barrier metal, as required. The barrier metal layer enhances adhesiveness (solder wettability) between the aluminum pad 24 and the first low melting point solder layer 16, and at the same time prevents the solder metal from dispersing within the electrode material of the microchip 11. As a barrier metal, a stacked film of a titanium film/copper film/nickel film structure, a stacked film of a titanium film/nickel film/palladium structure, and so forth are used.

Such a low dielectric constant insulating film 22 as aforementioned contributes to a reduction of the inter-line capacity and consequent speedier and pitch-finer signal wiring, but on the other hand, it has such a disadvantage that its mechanical strength and adhesion strength are low. Specifically, the adhesion strength between the low dielectric constant insulating films 22 or the adhesion strength of the low dielectric constant insulating film 22 against the semiconductor substrate, metal film, insulating film and so forth are 15 J/m² or less. As aforementioned, the low dielectric constant insulating film 22 tends to cause cracking or exfoliation in the film itself or in the stack layer interface thereof, because of the stress and so forth caused by the thermal expansion coefficient difference between the microchip 11 and the circuit substrate 12. The semiconductor device 10 according to the present embodiment is effective against such cracking, exfoliation, and so forth attributed to the low dielectric constant insulating film 22, as described later. Note, however, that the microchip 11 is not limited to one having the low dielectric constant insulating film 22 therein, and naturally, a microchip not including the low dielectric constant insulating film can also be applied.

Figure 4:
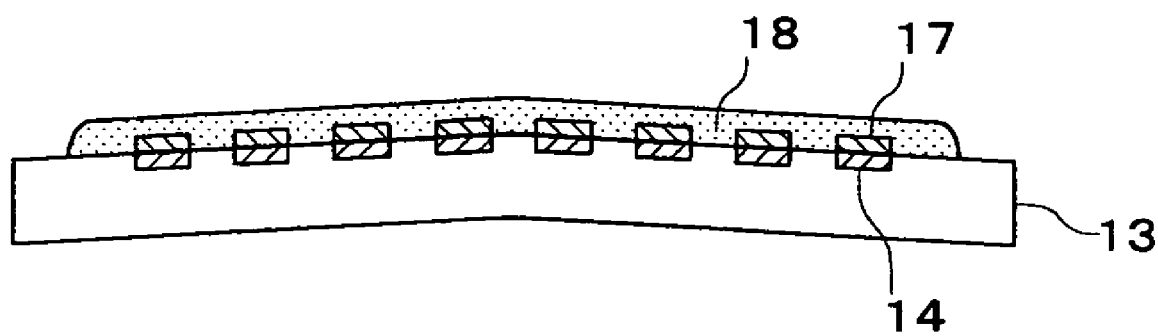
FIG. 4 is a view of a general configuration of a circuit substrate applied in the semiconductor device shown in FIG. 1.

As the circuit substrate 13 on which the microchip 11 is mounted, substrates composed of varieties of materials such as resin substrate, ceramics substrate, glass substrate, and so forth can be used. As a resin substrate, a multi-layer copper laminate board (multi-layer printed circuit board) which is used in general and so forth are used. As shown in FIG. 4, the circuit substrate 13 has the second electrode pads 14 in positions corresponding to the solder bumps 15 when the microchip 11 is flip-chip bonded. On the second electrode pads 14 of the circuit substrate 13 are formed the low melting point solder layers 17, as with the microchip 11. The constituent materials and forming method of the second low melting point solder layers 17 are identical to those for the first low melting point solder layers 16.

Here, the circuit substrate 13 in general exhibits warp of about 20 to 50 μm in the mounting area of 15 to 20 mm of square (the area including the second electrode pads 14). The warp of the circuit substrate 13 is attributed to the manufacturing process and constituent materials thereof, and normally unavoidable. To the surface of such circuit substrate 13 (the surface including the electrode pads 14), the sealing resin 18 having flux function is applied in the step prior to bonding. Note that the sealing resin 18 having the flux function may be applied to the surface of the microchip 11, however, preferably it is applied to the surface of the circuit substrate 13 so as to secure the applying amount of the sealing resin 18.

Figure 5:
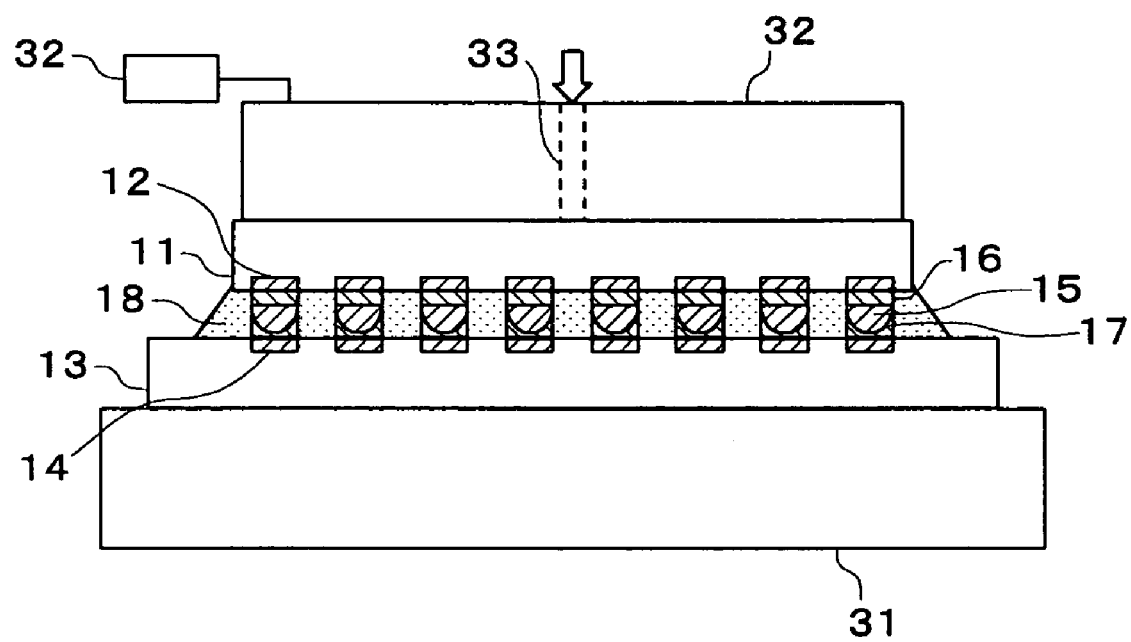
FIG. 5 illustrates a step of heating and dissolving a low melting point solder layer in a process of manufacturing the semiconductor device shown in FIG. 1.

The flip-chip bonding between the microchip 11 and the circuit substrate 13 is performed as follows. Fist, as shown in FIG. 5, the circuit substrate 13 is placed on a mounting stage 31. In the mean time, the microchip 11 is absorbed and retained by a mounting tool 32. The mounting tool 32 includes absorption holes 33 to absorb and retain the microchip 11 and a heating mechanism 34 to heat the microchip 11. The mounting tool 32 is preheated to a temperature at which only the low melting point solder layers 16, 17 melt (the temperature at the melting point $Mp_1$ of the low melting point solder or higher and lower than the melting point $Mp_2$ of the high melting point solder). Subsequently, the first electrode pads 12 of the microchip 11 and the second electrode pads 14 of the circuit substrate 13 are aligned, and thereafter the microchip 11 is pressed onto the circuit substrate 13 through over the sealing resin 18.

It is preferable to set the amount of each of the solder bump 15, the first low melting point solder layer 16, and the second low melting pint solder layer 17, where the solder bump 15 is composed of high melting point solder, such that the ratio between the volume of the solder bump 15 and the total volume of the first and second low melting point solder layers 16, 17 is in the range of 4:1 to 1:1, and that the ratio of the volume of the first low melting point solder layer 16 and the volume of the second low melting point solder layer 17 is in the range of 1:1.6 to 1.6:1. When the ratio of the volume of the solder bump 15 consisting of the high melting point solder (with respect to the total of the solder layers 15, 16, and 17) is less than 50%, the melting point of the bonding alloy formed by eventually dissolving the solder bump 15 descends and the thermal cycle characteristics, reliability, and so forth of the component in which the semiconductor device 10 is used deteriorate. On the other hand, if the ratio of the volume of the solder bump 15 exceeds 80%, the disconnection controlling effect and the stress reducing effect by the first and second low melting point solder layers 16, 17 deteriorate. Further, between the first low melting point solder layer 16 and the second low melting point solder layer 17, if the ratio of the volume of one layer with respect to that of the other layer exceeds 1.6, the disconnection controlling effect and the stress reducing effect of the low melting solder layer having less volume deteriorate.

Furthermore, the thickness of the first and second low melting point solder layers 16, 17 are preferably in the range of 50 to 80% respectively with respect to the amount of warp of the circuit substrate 13 within the mounting area. When the thickness of each of the low melting point solder layers 16, 17 is less than 50% of the amount of warp of the circuit substrate 13, the tracing by the low melting point solder layers 16, 17 of the warping back of the circuit substrate 13 may be incomplete On the other hand, when the thickness of each of the low melting solder layers 16, 17 is more than 80% of the warp amount of the circuit substrate 13, the amount of the high melting point solder composing the solder bump 15 decreases proportionally, leading to deterioration of the heat cycle characteristics, reliability, and so forth of the component in which the semiconductor device 10 is used. The total thickness of the first and second low melting point solder layers 16, 17 is preferably in a range of 100 to 160% of the warp amount of the circuit substrate 13 within the mounting area.

The sealing resin 18 and the first and second low melting point solder layers 16, 17 are then heated while the microchip 11 is pressurized and kept in the state of being pressed onto the circuit substrate 13. At this stage, the circuit substrate 13 is in a parallel state because of the pressed force. The heating temperature is, as aforementioned, at a level at which only the low melting point solder layers 16, 17 melt, that is to say, at the temperature of the melting point $Mp_1$ of the low melting point solder or higher and lower than the melting point $Mp_2$ of the high melting point solder. The flux function of the sealing resin 18 heated and activated eliminates the oxide film, foreign substance, and so forth in the bonding interface, and only the first and second low melting point solder layers 16, 17 are dissolved and bonded to the solder bump 15. More specifically, the solder bump 15 and the second low melting point solder layer 17 are bonded together by allowing the second low melting point solder layer 17 which is melting to wet up to the sides of the solder bump 15. The microchip 11 and the circuit substrate 13 are thus tentatively bonded.

Note that the heating of the sealing resin 18 and the first and second low melting point solder layers 16, 17 may be performed by using a heating mechanism provided on the side of the mounting stage 31. The heating mechanism on the side of the mounting stage 31 may be used concurrently with the heating mechanism 34 provided in the mounting tool 32. In other words, the heating of the sealing resin 18 and the first and second low melting point solder layers 16, 17 can be performed by using at least one of the heating mechanism 34 provided in the mounting tool 32 and the heating mechanism provided in the mounting stage 31.

Figure 6:
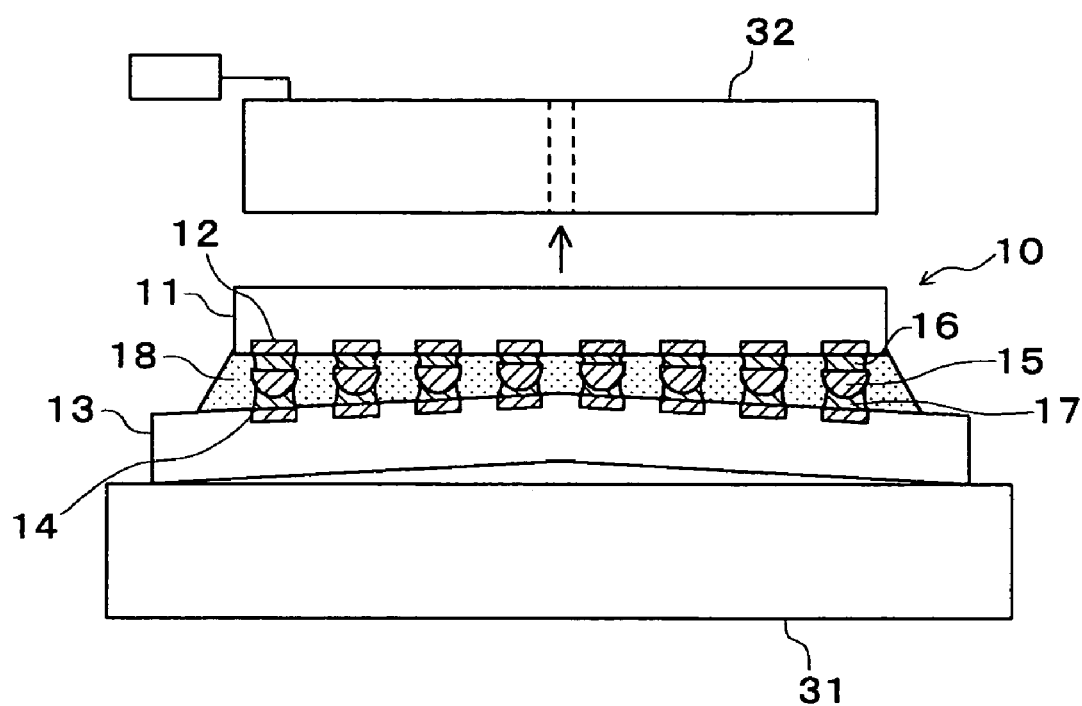
FIG. 6 illustrates a state in which pressing force against the semiconductor element is released after the heating and dissolving step shown in FIG. 5.
Figure 7:
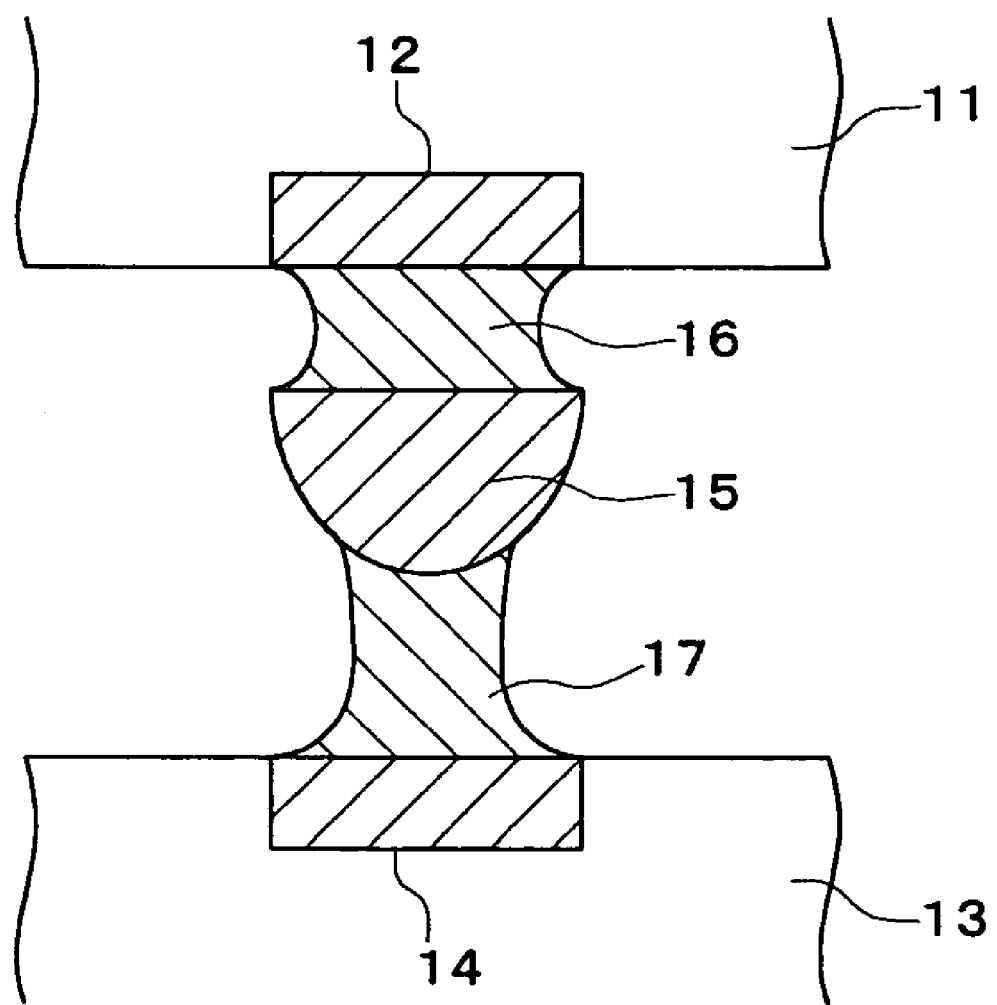
FIG. 7 is a sectional view of a configuration of a connection part of the semiconductor device in FIG. 1, which is shown enlarged.

Subsequently, as shown in FIG. 6, the microchip 11 is released from the mounting tool 32. At this stage, the circuit substrate 13 warps back since the pressing force imposed on the microchip 11 is eliminated. The first and second low melting point solder layers 16, 17 immediately after releasing the pressure are in the melting state, and as shown in FIG. 7, are respectively extended tracing the warping back of the circuit substrate 13. Thus, the extension of the first and second low melting point solder layers 16, 17 allows an increase in the amount of tracing of the warping back of the circuit substrate 13. This can lead to a substantial control of disconnections in the bump connecting part attributed to warping back of the circuit substrate 13 immediately after the pressing force is released.

Furthermore, in the bonding step where only the first and second low melting point solder layers 16, 17 are dissolved (tentative bonding step), the thermal stress due to the thermal expansion coefficient difference between the microchip 11 and the circuit substrate 12 is imposed on the side of the microchip 11. Although the thermal stress caused at this stage is small if the microchip 11 having therein the low dielectric constant insulating film 22, of which mechanical and adhesion strengths are low, is used, the low dielectric constant insulating film 22 may cause cracking, exfoliation, and the like. With respect to this point, in the semiconductor device 10 of the present embodiment, the first and second low melting point solder layers 16, 17 respectively function as stress reducing layers, making it possible to control occurrence of cracking, exfoliation, and the like attributed to the low dielectric constant insulating film 22.

Subsequently, the sealing resin 18 with flux function is cured, such that the semiconductor device 10 shown in FIG. 1 is obtained. In the semiconductor device 10 of the present embodiment, only the first and second low melting point solder layers 16, 17 are heated, dissolved, and then bonded to the solder bump 15, while the sealing resin 18 is cured. With the semiconductor device 10 thus processed, the solder bump 15 and the first and second low melting point solder layers 16, 17 are dissolved with the heat generated during the solder reflowing process with which the external electrodes are formed, and the microchip 11 and the circuit substrate 13 are finally bonded. In the final bonding process, thermal stress is also imposed on the microchip 11, but as in the tentative bonding process, the first and second low melting point solder layers 16, 17 respectively function as stress reducing layers, such that cracking, exfoliation, and the like attributed to the low dielectric constant insulating film 22 can be controlled.

In the semiconductor device 10 of the present embodiment described above, the low melting point solder layers 16, 17 are respectively arranged between the solder bump 15 and the first and second electrode pad 12, 14. Accordingly, in the flip-chip bonding process using the sealing resin 18 having flux function, even when the circuit substrate warps back immediately after releasing the pressing force for bonding, the first and second low melting point solder layers 16, 17 respectively are extended, tracing the warping back of the circuit substrate 13. This allows significant control of disconnections in the bump connecting part caused by the warping back of the circuit substrate 13. The control of the disconnections substantially contributes to improvement of the yield in manufacturing the semiconductor device using the sealing resin with flux function.

Further, the first and second low melting point solder layers 16, 17 function as stress reducing layers in the tentative bonding process (flip-chip bonding process) and the final bonding process (process of dissolving the solder bumps). Accordingly, even when the microchip 11 is applied which includes the low dielectric constant insulating film 22 having the low mechanical and adhesion strengths, the cracking, exfoliation, and so forth attributed to the low dielectric constant insulating film 22 can be restrained. This makes it possible not only to curb the failure occurrence ratio but also to enhance reliability in actual use. In particular, even when the solder bump 15 is formed of a lead (Pb)-free solder having the melting point higher than that of Sn—Pb eutectic solder, any cracking, exfoliation, etc. attributed to the low dielectric constant insulating film 22 can be controlled with high repeatability.

Figure 8:
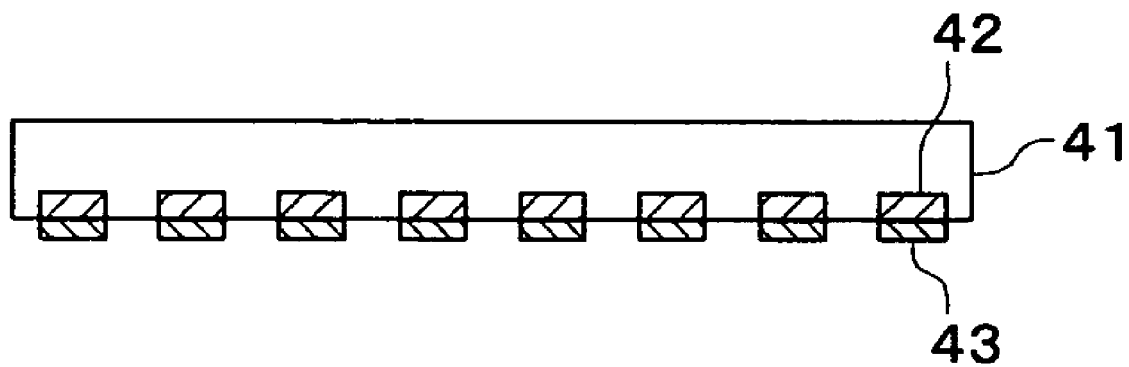
FIG. 8 is a diagrammatic view showing a configuration of a semiconductor element applied in a semiconductor device according to a second embodiment of the present invention.
Figure 9:
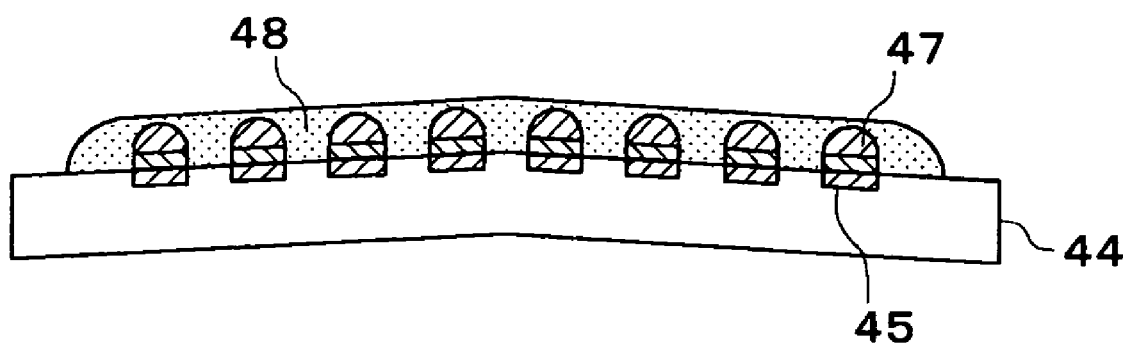
FIG. 9 is a diagrammatic view showing a configuration of circuit substrate applied in the semiconductor device according to the second embodiment of the present invention.

Next, a semiconductor device according to a second embodiment of the present invention is explained with reference to FIG. 8 to FIG. 11. In the semiconductor device according to the second embodiment, solder bumps composed of high melting point solder are formed on the side of the circuit substrate. A microchip 41, which is a constituent element of one side of the semiconductor device, has a plurality of first electrode pads 42 formed on the surface thereof, as shown in FIG. 8. On the first electrode pads 42, first low melting point solder layers 43 are respectively formed. The microchip 41 contains, as with the first embodiment described above, a circuit part which includes copper wiring and low dielectric constant insulating film, for example. However, the circuit part constituents are not limited thereto.

On a circuit substrate 44 over which the microchip 41 is to be mounted, are formed second low melting point solder layers 45 in positions corresponding to the first electrode pads 42 upon flip-chip bonding to the microchip 41. On the second electrode pads 45 of the circuit substrate 44 are formed low melting point solder layers 46, further on which are formed solder bumps 47 composed of high melting point solder. As a constituent material of the first and second low melting point solder layers 43, 46, and the solder bumps 47, is used solder metal similar with those for the first embodiment. Further, the forming method and shapes of the each of the layers 43, 46, 47, as well as the volume ratio of the first and second low melting point solder layers 43, 46 with respect to the solder bumps 47, are preferably in the similar manner with the first embodiment.

Here, the circuit substrate 44 generally exhibits warp of 20 to 50 μm with respect to a mounting area of 15 to 20 mm of square (the area where the second electrode pads 45 are provided). To the surface of the circuit substrate 44 (the surface where the solder bumps 47 are provided) is applied a sealing resin 48 having flux function during a previous process to bonding. As the sealing resin 48, one having flux function similar with that of the first embodiment is used. The sealing resin 48 having flux function is applied so as to fill in projections and depressions formed by the solder bump 47. Such application of the sealing resin 48 to the circuit substrate 44 including the solder bumps 47 constrains any air inclusion during the bonding process and consequent occurrence of voids.

Figure 10:
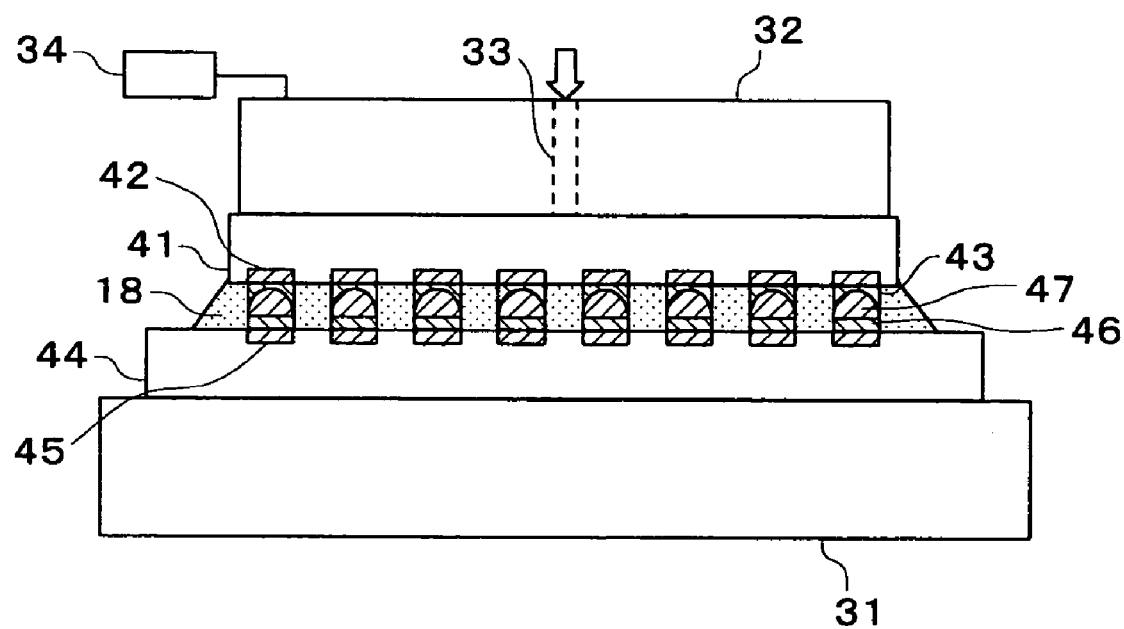
FIG. 10 illustrates a step of heating and dissolving a low melting point solder layer according to the second embodiment of the present invention.

The flip-chip bonding of the microchip 41 and the circuit substrate 44 is performed as follows. First, as shown in FIG. 10, the circuit substrate 44 is placed on the mounting stage 31. On the other hand, the microchip 41 is absorbed and retained by the mounting tool 32. The mounting tool 32 is preheated to a temperature at which only the low melting point solder layers 43, 46 melt (the temperature which is at the melting point $Mp_1$ of the low melting point solder or higher and lower than the melting point $Mp_2$ of the high melting point solder). Subsequently, the first electrode pads 42 of the microchip 41 and the second electrode pads 45 of the circuit substrate 44 are aligned, and thereafter the microchip 41 is pressed onto the circuit substrate 44 through over the sealing resin 48.

The sealing resin 48 and the first and second low melting point solder layers 43, 46 are heated while retaining the state in which the microchip 41 is pressurized and pressed onto the circuit substrate 44. At this stage, the circuit substrate 44 is in a parallel state because of the pressing force. The heating temperature should be a temperature at which only the low melting point solder layers 43, 46 are dissolved. The flux function of the sealing resin 48 heated and activated eliminates the oxide film, foreign substance, and so forth in the bonding interface, and the first and second low melting point solder layers 43, 46 are dissolved and bonded to the solder bump 47. More specifically, the solder bump 47 and the first low melting point solder layer 43 are bonded together by allowing the first low melting point solder layer 43 which is melting to wet up to the sides of the solder bump 47. Note that heating of the sealing resin 48 and the first and second low melting point solder layers 43, 46 is performed by using at least one of the heating mechanism 34 provided in the mounting tool 32 and the heating mechanism provided on the side of the mounting stage 31.

Subsequently, the microchip 41 is released from the mounting tool 32. At this stage, the circuit substrate 44 is warped back since the pressing force imposed on the microchip 41 is eliminated. The first and second low melting point solder layers 43, 46 immediately after releasing the pressure are in the melting state, and are respectively extended tracing the warping back of the circuit substrate 44, similarly with the state shown in FIG. 7. This allows substantial constraint of disconnections in the bump connecting part caused by warping back of the circuit substrate 44 immediately after the pressure is released.

Figure 11:
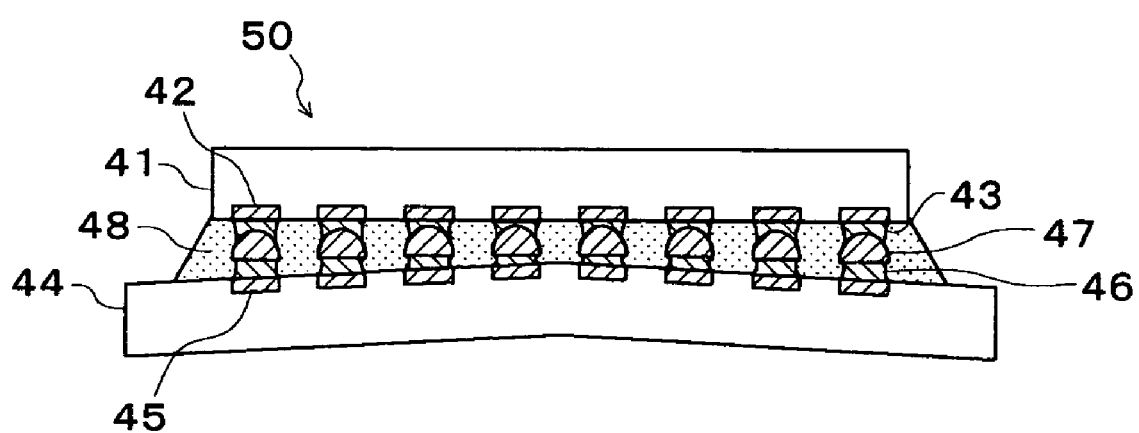
FIG. 11 is a diagrammatic view showing a configuration of the semiconductor device according to the second embodiment of the present invention.
Figure 12:
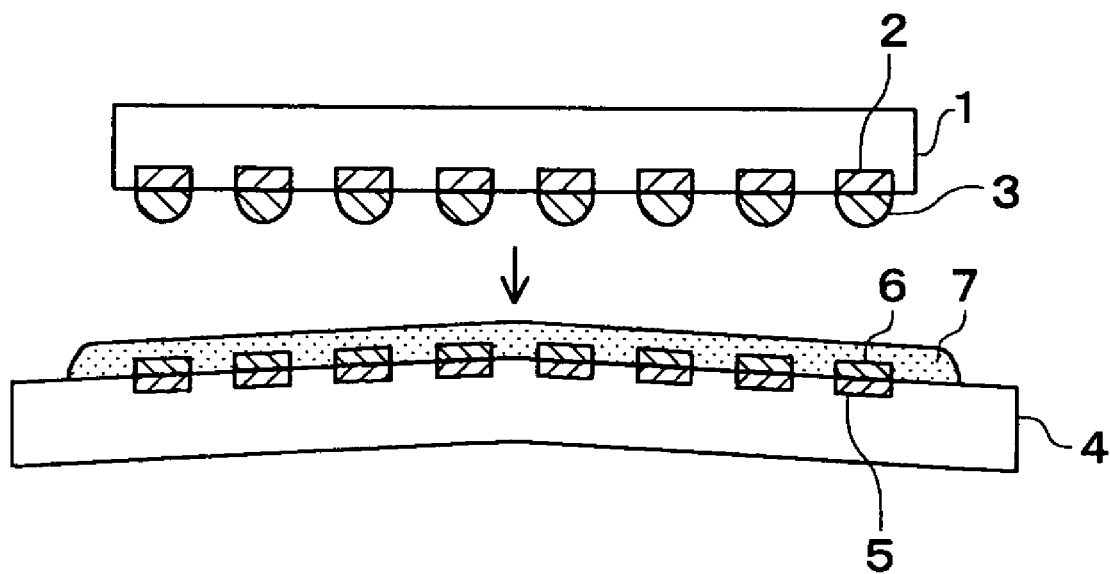
FIG. 12 illustrates an example of a semiconductor element and a circuit substrate applied in the conventional semiconductor device.
Figure 13:
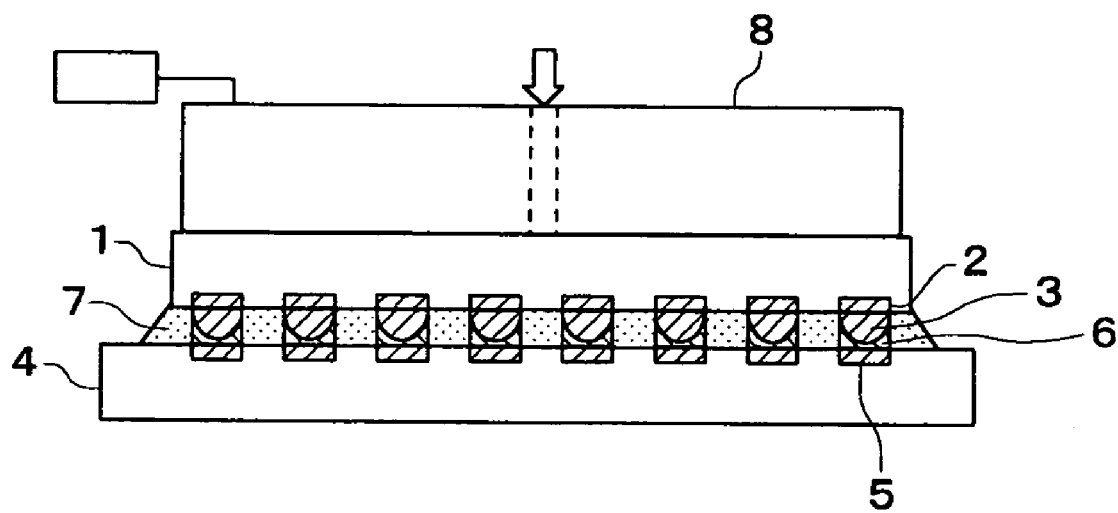
FIG. 13 illustrates a step of heating and dissolving a low melting point solder layer in the conventional manufacturing process of a semiconductor device.
Figure 14:
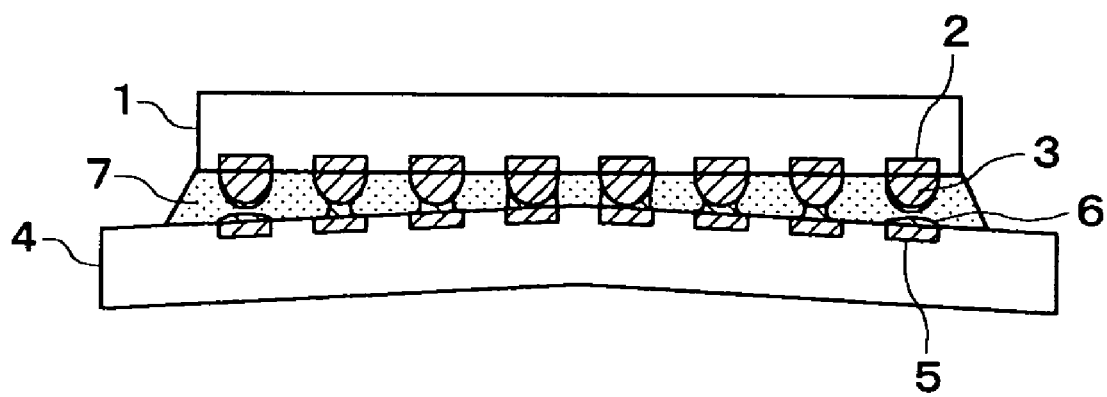
FIG. 14 illustrates a state in which pressing force against the semiconductor element is released after the heating and dissolving step shown in FIG. 13, and a configuration of the conventional semiconductor device.
Figure 15:
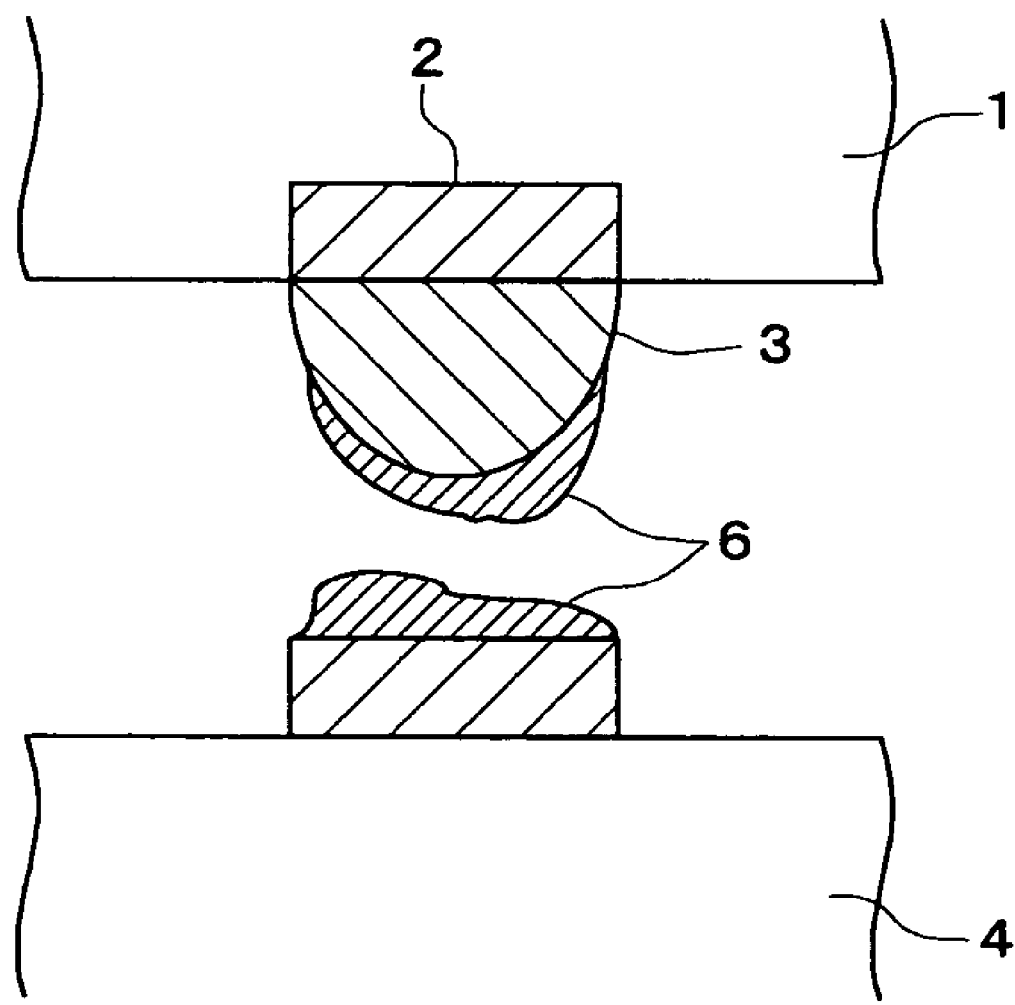
FIG. 15 is a sectional view of a connection part of the semiconductor device shown in FIG. 14, shown enlarged.

Thereafter, the sealing resin 48 with the flux function is cured so that a semiconductor device 50 shown in FIG. 11 is obtained. Specifically, the semiconductor device 50 of the present invention comprises the configuration (flip-chip bonding configuration) in which the first electrode pads 42 provided on the microchip 41 and the second electrode pads 45 provided on the circuit substrate 44 are electrically and mechanically bonded through the solder bumps 47 formed of the high melting point solder and the first and second low melting point solder layers 43, 46, which are connected respectively to the solder bumps 47. The gap portion between the microchip 41 and the circuit substrate 44 is filled in with the sealing resin 48 as the underfill material. The sealing resin 48 is hardened by the curing treatment.

The semiconductor device 50 of the second embodiment is in a state in which the first and second low melting point solder layers 43, 46 only are heated, dissolved and bonded to the solder bumps 47, and the sealing resin 48 is cured. In the semiconductor device 50 in such a state, the solder bumps 47 and the first and second low melting point solder layers 43, 46 are dissolved with heat generated in the solder reflowing process for forming the external electrodes thereafter, such that the microchip 41 and the circuit substrate 44 are finally bonded together.

In the semiconductor device 50 of the second embodiment described above, the low melting point solder layers 43, 46 are respectively arranged between the solder bumps 47 composed of the high melting point solder and the first and second electrode pads 42, 45. Accordingly, in the flip-chip bonding process using the sealing resin 48 having flux function, even when the circuit substrate 44 warps back immediately after the pressing force for bonding is released, the first and second low melting point solder layers 43, 46 respectively are extended, tracing the warping back of the circuit substrate 44. This allows substantial constraint of disconnections in the bump connecting part caused by warping back of the circuit substrate 44. Such constraint of disconnections contributes significantly to improvement of the yield in manufacturing the semiconductor device using the sealing resin with flux function.

Furthermore, the first and second low melting point solder layers 43, 46 function as stress reducing layers in the tentative bonding process (flip-chip bonding process) and the final bonding process (solder bump dissolving process). Accordingly, even when the microchip 41 including the low dielectric constant insulating film of low mechanical and adhesion strengths is applied, cracking, exfoliation, and so forth attributed to the low dielectric constant insulating film can be constrained. This makes it possible to reduce the failure occurrence ratio in the process of manufacturing the semiconductor device 50, and at the same time enhance the reliability in actual use. In particular, even when the solder bump 47 is formed of a lead (Pb)-free solder having the melting point higher than that of Sn—Pb eutectic solder, any cracking, exfoliation, and so forth attributed to the low dielectric constant insulating film can be controlled with high repeatability.

It should be noted that the present invention is not to be limited within the specific embodiments herein described with illustrations, and may be applied to varieties of semiconductor devices and manufacturing methods thereof in which the flip-chip bonding is conducted using the sealing resin with flux function. All modifications so as to be within the range of the following claims, as well as the semiconductor devices and manufacturing methods thereof referred to above are considered as inclusive in the present invention.

What is claimed is:

1. A semiconductor device, comprising:
   a semiconductor element including a semiconductor element body comprising a low dielectric constant insulating film having a relative dielectric constant of 3.5 or less and a lower adhesion strength of 15 J/m² or less with respect to a material selected from the group consisting of a semiconductor substrate, a metal film, and an insulating film, a first electrode pad, and a first low melting point solder layer formed on the first electrode pad;
   a circuit substrate including a second electrode pad corresponding to the first electrode pad, and a second low melting point solder layer formed on said second electrode pad;
   a connection part including a solder bump composed of high melting point solder formed on one low melting point solder layer selected from the group consisting of the first and the second low melting point solder layers, and in which the first and second electrode pads are connected through the solder bump bonded to the other low melting point solder layer; and a sealing resin which is filled in between the semiconductor element and the circuit substrate so as to seal the connection part, and has flux function, wherein a ratio between the volume of the solder bump and the total volume of the first and second low melting point solder layers is in a range of 4:1 to 1:1, and a ratio between the volume of the first low melting point solder layer and the second low melting point solder layer is in a range of 1:1.6 to 1.6:1.

2. The semiconductor device according to claim 1, wherein the semiconductor element comprises a circuit part constituted of a wiring and the low dielectric constant insulating film.

3. The semiconductor device according to claim 1, wherein the solder bump is formed of a material selected from the group consisting of a tin-silver (Sn—Ag) solder alloy, a tin-silver-copper (Sn—Ag—Cu) solder alloy, a tin-zinc (Sn—Zn) solder alloy, and a tin-lead (Sn—Pb) solder alloy.

4. The semiconductor device according to claim 3, wherein the solder bump is composed of a solder alloy not substantially including lead.

5. The semiconductor device according to claim 1, wherein the first and second low melting point solder layers are formed of a material selected from the group consisting of a tin-bismuth (Sn—Bi) solder alloy, a tin-bismuth-silver (Sn—Bi—Ag) solder alloy, a tin-zinc-bismuth (Sn—Zn—Bi) solder alloy, a bismuth-indium (Bi—In) solder alloy, a bismuth-palladium (Bi—Pd) solder ally, a tin-indium (Sn—In) solder alloy, and an indium-silver (In—Ag) solder alloy.

6. The semiconductor device according to claim 5, wherein the first and second low melting point solder layers are formed of a solder alloy including bismuth.

7. The semiconductor device according to claim 1, wherein the first and second low melting point solder layers respectively have thicknesses in a range of a bout 50 to 80% with respect to the amount of warp in a mounting area of the circuit substrate.

8. The semiconductor device according to claim 1, wherein a projection formed of the solder bump and the one low melting point solder layer has height in a range of 75 to 100% with respect to the largest diameter of the solder bump.

9. The semiconductor device according to claim 1 wherein the low dielectric constant insulating film is a film selected from the group consisting of a carbon-doped silicon oxide film, an organic silica film, and a porous hydrogen silsesquloxane film.

* * * * *

UNITED STATES PATENT AND TRADEMARK OFFICE
CERTIFICATE OF CORRECTION

PATENT NO. : 7,202,569 B2
APPLICATION NO. : 10/986385
DATED : April 10, 2007
INVENTOR(S) : Tomono It is certified that error appears in the above-identified patent and that said Letters Patent is hereby corrected as shown below:

Claim 7, column 14, line 12, change "a bout" to --about--.

Claim 9, column 14, line 24, change "silsesquloxane" to --silsesquioxane--.

Signed and Sealed this

Thirty-first Day of July, 2007

JON W. DUDAS
*Director of the United States Patent and Trademark Office*